United States Patent
Yun et al.

(10) Patent No.: US 7,666,786 B2
(45) Date of Patent: Feb. 23, 2010

(54) METHODS OF FABRICATING SEMICONDUCTOR DEVICES HAVING A DOUBLE METAL SALICIDE LAYER

(75) Inventors: Jong-ho Yun, Gyeonggi-do (KR);
Gil-heyun Choi, Gyeonggi-do (KR);
Seong-hwee Cheong, Seoul (KR);
Sug-woo Jung, Gyeonggi-do (KR);
Hyun-su Kim, Gyeonggi-do (KR);
Woong-hee Sohn, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 11/756,903

(22) Filed: Jun. 1, 2007

(65) Prior Publication Data

US 2007/0224765 A1    Sep. 27, 2007

Related U.S. Application Data

(63) Continuation of application No. 11/044,884, filed on Jan. 27, 2005, now Pat. No. 7,238,612.

(30) Foreign Application Priority Data

Mar. 5, 2004    (KR) .............................. 2004-14958

(51) Int. Cl.
*H01L 21/44* (2006.01)
(52) U.S. Cl. .................... 438/655; 257/E21.165
(58) Field of Classification Search ................ 438/649, 438/655; 257/E21.165
See application file for complete search history.

(56) References Cited

U.S. PATENT DOCUMENTS

| 5,869,396 | A | 2/1999 | Pan et al. .................... 438/647 |
| 5,924,008 | A | 7/1999 | Michael et al. | |
| 6,156,634 | A | 12/2000 | Liou | |
| 6,294,464 | B1 | 9/2001 | Trivedi | |

(Continued)

FOREIGN PATENT DOCUMENTS

KR    10-2001-0084501    9/2001

(Continued)

OTHER PUBLICATIONS

Notice to Submit Response for Korean Application No. 10-2004-0014958, dated Aug. 22, 2005.

*Primary Examiner*—W. David Coleman
(74) *Attorney, Agent, or Firm*—Myers Bigel Sibley & Sajovec, P.A.

(57) ABSTRACT

A semiconductor device is fabricated by forming a gate electrode structure, comprising a gate oxide layer pattern, a polysilicon layer pattern, and sidewall spacers on a silicon substrate, forming source/drain regions on both sides of the gate electrode structure in the silicon substrate, depositing a physical vapor deposition (PVD) cobalt layer on the gate electrode structure using PVD, depositing a chemical vapor deposition (CVD) cobalt layer on the PVD cobalt layer using CVD, annealing the silicon substrate to react the PVD and CVD cobalt layers with polysilicon on an upper surface of the gate electrode structure, stripping at least a portion of the PVD cobalt layer and the CVD cobalt layer that has not reacted, and annealing the silicon substrate after stripping the at least the portion of the PVD cobalt layer and the CVD cobalt layer.

12 Claims, 5 Drawing Sheets

U.S. PATENT DOCUMENTS

| | | |
|---|---|---|
| 6,403,458 B2 | 6/2002 | Trivedi et al. |
| 6,514,859 B1 | 2/2003 | Erhardt et al. ............... 438/664 |
| 6,740,585 B2 | 5/2004 | Yoon et al. |
| 6,759,675 B2 | 7/2004 | Csutak et al. |
| 6,815,235 B1 | 11/2004 | Markle |
| 2005/0003663 A1 | 1/2005 | Pan et al. |

FOREIGN PATENT DOCUMENTS

| | | |
|---|---|---|
| KR | 10-2002-0002546 | 1/2002 |
| KR | 10-2004-0002003 | 1/2004 |

METHODS OF FABRICATING SEMICONDUCTOR DEVICES HAVING A DOUBLE METAL SALICIDE LAYER

RELATED APPLICATIONS

This application is a continuation of U.S. patent application Ser. No. 11/044,884, filed Jan. 27, 2005 now U.S. Pat No. 7,238,612, which claims the benefit of and priority to Korean Patent Application No. 2004-14958 filed Mar. 5, 2004, the disclosures of which are hereby incorporated herein by reference.

FIELD OF THE INVENTION

The present invention relates generally to integrated circuit devices and, more particularly, to methods of fabricating semiconductor devices.

BACKGROUND OF THE INVENTION

There is continuing demand for semiconductor devices that have higher speed, lower power consumption, and higher integration density. The integration density can be increased by minimizing the dimensions of various elements, such as the width of gate lines, the junction depth of source/drain regions, and the sectional area of contacts. However, such microscopic patterns may increase the resistance of the semiconductor device, slow the operating speed, and/or increase the power consumption of the semiconductor device.

One method of solving the above-stated problems is to use metal silicide, which is a compound of a metal and silicon, in place of polysilicon. Examples of metal silicides include tungsten silicon, titanium silicide, and cobalt silicide. Because cobalt silicide is generally thermally and chemically stable and has a small sheet resistance, it is widely used for semiconductor devices that require high speed operation, low power consumption, and/or high integration density. When forming a cobalt silicide layer, a cobalt layer and a barrier metal layer may be sequentially stacked on a silicon surface and subjected to primary annealing, stripping to remove the unreacted cobalt layer and the barrier metal layer, and secondary annealing.

Conventionally, when forming a cobalt silicide layer, a cobalt layer that is formed by physical vapor Deposition (PVD) (PVD cobalt layer) may be used. (hereinafter a cobalt salicide layer formed using a PVD cobalt layer is referred to as a "PVD cobalt salicide layer.") Because it may include slight impurities and may prevent the formation of an interfacial oxide layer, the PVD cobalt salicide layer has a relatively low sheet resistance. Moreover, the PVD cobalt salicide layer is generally stable to a subsequent thermal budget, resulting in a relatively small junction leakage current. Therefore, the PVD cobalt salicide layer is commonly used in high-speed semiconductor memory devices.

However, the microscopic fine patterns resulting from increased integration density may raise problems when forming the salicide layer by a conventional method. For example, as the gate width decreased to less than 90 nm, the PVD cobalt salicide layer formed on a gate line may become agglomerated in subsequent annealing. When agglomeration occurs, the sheet resistance of the PVD cobalt salicide layer may increase, which may obstruct high speed operation. Furthermore, more severe agglomeration may cause disconnection of the PVD cobalt salicide layer.

One method suggested to solve the agglomeration problem is to form a Ni salicide layer or a NiTa salicide layer on the gate line instead of a PVD cobalt salicide layer. Even when formed on a gate line narrower than 90 nm, however, the Ni salicide layer or NiTa salicide layer suffer virtually no agglomeration in subsequent annealing. However, the NiSi layer phase shifts into a $NiSi_2$ layer during the subsequent annealing, which increases its sheet resistance. Accordingly, to use the Ni salicide layer or the NiTa salicide layer, the subsequent annealing must be changed, which may require reinvestment in manufacturing facilities and/or other costs. As a result, it may be expensive and time consuming to form the Ni salicide layer or the NiTa salicide layer.

When the salicide layer is formed on source/drain regions, it is desirable to prevent increases in junction leakage in spite of forming microscopic patterns.

Particularly, a cobalt salicide layer formed using a cobalt layer deposited by CVD (hereinafter referred to as a "CVD cobalt salicide layer") involves generally severe topography on its bottom surface profile and relatively high junction leakage current.

U.S. Pat. No. 6,514,859 to Erhardt et al., entitled "Method of Salicide Formation with a Double Gate Silicide," discloses one way of decreasing the resistance of a gate line and improving the characteristic of junction leakage current in the source/drain junction area. According to this patent, silicidation is performed twice to make the silicide layer thick on the upper surface of the gate line. On the other hand, silicidation is performed once to make the silicide layer thin on the source/drain junction area. This is achieved by extra patterning to expose the gate line after forming a barrier insulating layer such as an SOG layer. Consequently, the manufacturing process may be complicated and expensive.

SUMMARY OF THE INVENTION

According to some embodiments of the present invention, a semiconductor device is fabricated by forming a gate electrode structure, comprising a gate oxide layer pattern, a polysilicon layer pattern, and sidewall spacers on a silicon substrate, forming source/drain regions on both sides of the gate electrode structure in the silicon substrate, depositing a physical vapor deposition (PVD) cobalt layer on the gate electrode structure using PVD, depositing a chemical vapor deposition (CVD) cobalt layer on the PVD cobalt layer using CVD, annealing the silicon substrate to react the PVD and CVD cobalt layers with polysilicon on an upper surface of the gate electrode structure, stripping at least a portion of the PVD cobalt layer and the CVD cobalt layer that has not reacted, and annealing the silicon substrate after stripping the at least the portion of the PVD cobalt layer and the CVD cobalt layer.

In other embodiments, the PVD cobalt layer is deposited at a temperature of about 300 to 400° C., and the CVD cobalt layer is deposited at a temperature of about 100 to 200° C.

In still other embodiments, depositing the CVD cobalt layer and annealing the silicon substrate to react the PVD and CVD cobalt layers are performed in-situ.

In still other embodiments, annealing the silicon substrate to react the PVD and CVD cobalt layers is performed at a pressure of about $10^{-9}$ to $10^{-3}$ torr.

In still other embodiments depositing the CVD cobalt layer is performed at a pressure of about $10^{-3}$ to 20 torr.

In still other embodiments, the PVD cobalt layer and the CVD cobalt layer each have a thickness of about 10 to 190 Å.

In still other embodiments, depositing the CVD cobalt layer comprises forming the cobalt layer by MOCVD using a cobalt precursor defined by the chemical formula: $Co_2(CO)_6$ ($R_1$—C≡C—$R_2$) where, $R_1$ includes H or $CH_3$, and $R_2$ includes hydrogen, t-butyl, phenyl, methyl or ethyl, as a source gas.

In still other embodiments, the cobalt precursor is $CO_2(CO)_6(HC≡C^tBu)$, $Co_2(CO)_6(HC≡CPh)$, $CO_2(CO)_6(HC≡CH)$, $CO_2(CO)_6(HC≡CCH_3)$ or $Co_2(CO)_6(CH_3C≡CCH_3)$.

In still other embodiments, depositing the CVD cobalt layer comprises forming a preliminary CVD cobalt layer using MOCVD by supplying the cobalt precursor as the source gas, treating a surface the preliminary cobalt layer under a hydrogen ambient to remove impurities included in the preliminary cobalt layer.

In still other embodiments, forming the preliminary CVD cobalt layer and treating the surface are each performed more than once.

In still other embodiments, depositing the PVD cobalt layer and depositing the CVD cobalt layer are performed in-situ.

In still other embodiments, the method further comprises forming a capping layer on the double cobalt layer before annealing the silicon substrate to react the double cobalt layer. Wherein stripping at least the portion of the double cobalt layer comprises stripping the capping layer and at least the portion of the double cobalt layer that has not reacted with the silicon surface.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
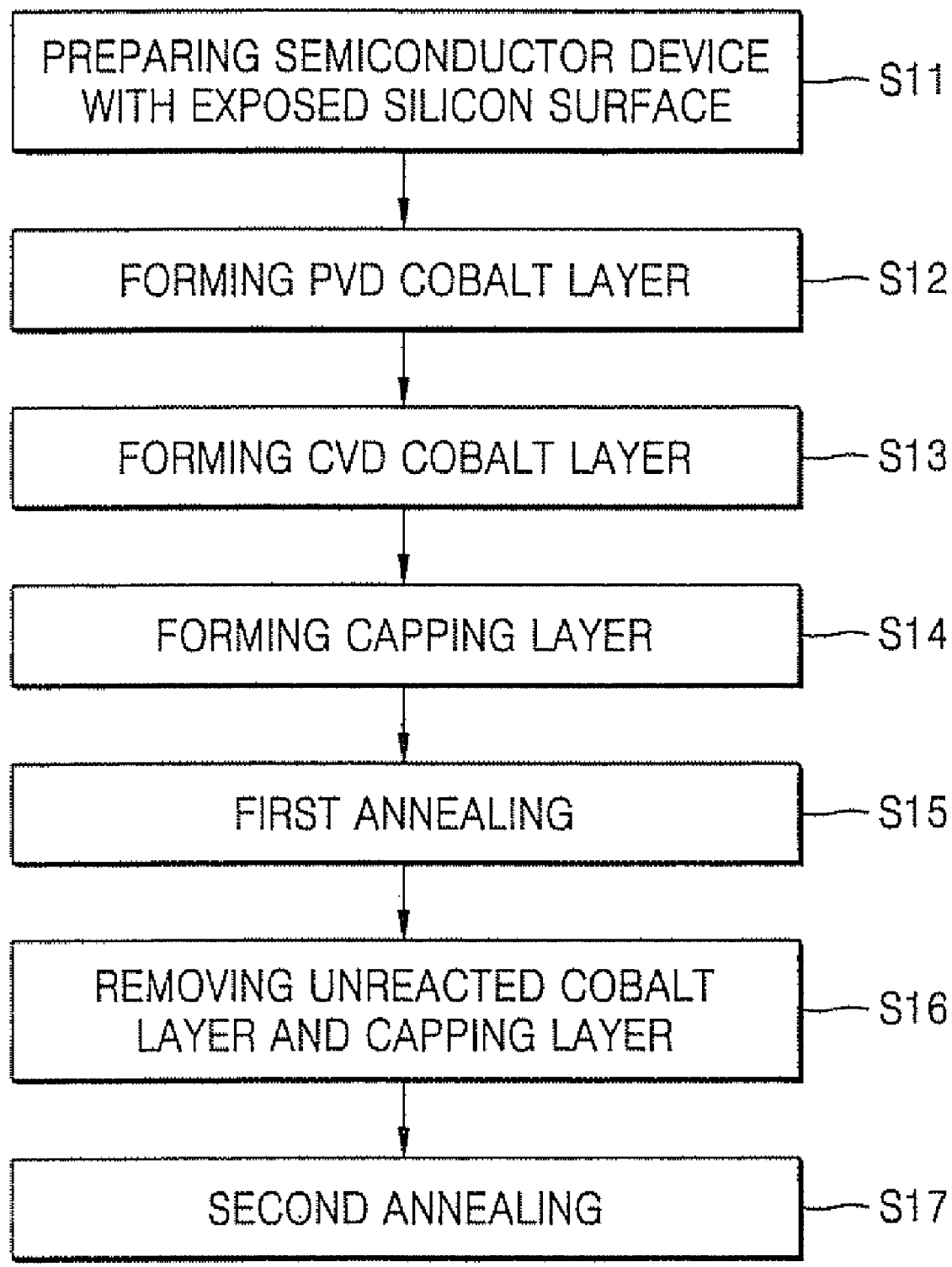
FIG. 1 is a flowchart that illustrates methods of forming a double cobalt salicide layer according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart that illustrates methods of forming a double cobalt salicide layer according to some embodiments of the present invention. Although described herein with reference to the formation of a cobalt salicide layer, it will be understood that the present invention is not limited to cobalt silicide; instead, various kinds of metal salicide layers may be formed in accordance with various embodiments of the present invention.

Referring to FIG. 1, a semiconductor device with an exposed silicon surface is prepared (S11). The semiconductor device includes various patterns formed in preceding steps. Also, the semiconductor device may have an exposed silicon substrate and/or a partially exposed pattern formed using silicon or polysilicon. A cobalt salicide layer is formed on the exposed silicon surface. For example, the exposed silicon surface may correspond to source/drain regions of a silicon substrate or the upper surface of a polysilicon pattern consisting of a gate line or a bit line.

A double cobalt layer comprising a PVD cobalt layer/CVD cobalt layer is formed on a surface of the semiconductor device (S12 and S13). Of the double cobalt layer, the PVD cobalt layer and the CVD cobalt layer may each have a thickness of about 10 to 300 Å, for example. In this case, the total thickness of the double cobalt layer may be about 50 to 500 Å. As shown in FIG. 1, the double cobalt layer may be formed by depositing the PVD cobalt layer and then depositing the CVD cobalt layer on the PVD cobalt layer. Alternatively, the CVD cobalt layer is deposited first and the PVD cobalt layer is deposited thereon.

To form the double cobalt layer, the PVD cobalt layer is first formed on the surface of the semiconductor device (S12). The PVD cobalt layer may be deposited by sputtering method at a temperature of about 300 to 400° C., for example, about 350° C. The deposition temperature incites a slight silicidation reaction at the interface of the PVD cobalt layer and silicon. A newly formed thin cobalt silicide layer may inhibit cobalt from deeply intruding into the silicon when annealing. Therefore, when the double cobalt layer is formed on the source/drain regions, the increase of junction leakage current of the source/drain regions can be more effectively prevented.

The CVD cobalt layer is formed on the PVD cobalt layer (S13). The CVD cobalt layer is formed at a temperature of about 100 to 200° C., for example, about 150° C. The CVD cobalt layer may be deposited by metal organic chemical vapor deposition (MOCVD).

To form the CVD cobalt layer, a cobalt precursor is vaporized by bubbling outside a processing chamber. The cobalt precursor exists in a liquid state at normal temperature, and so is generally thermally stable. The cobalt precursor may be a material defined by the chemical formula: $Co_2(CO)_6(R_1—C{\equiv}C—R_2)$ (where, $R_1$ includes H or $CH_3$, and $R_2$ includes hydrogen, T-butyl, phenyl, methyl or ethyl). For example, the cobalt precursor may be $Co_2(CO)_6(HC{\equiv}C^tBu)$, $Co_2(CO)_6(HC{\equiv}CPh)$, $Co_2(CO)_6(HC{\equiv}CH)$, $Co_2(CO)_6(HC{\equiv}CCH_3)$, or $Co_2(CO)_6(CH_3{\equiv}CCH_3)$. The cobalt precursor may be used solely or mixed. An exemplary cobalt precursor is $Co_2(CO)_6(HC{\equiv}C'Bu)$ (CCTBA).

Subsequently, the vaporized cobalt precursor is supplied to the chamber in which the semiconductor device is loaded. Argon (Ar) gas may be used as a carrier gas for the vaporized cobalt precursor. The vaporized cobalt precursor is supplied at a flow of about 10 to 100 sccm, and the carrier gas is supplied at a flow of about 50 to 250 sccm. By doing so, the CVD cobalt layer is formed on the PVD cobalt layer.

Generally, the CVD cobalt layer deposited by MOCVD is liable to include impurities such as carbon and oxygen. It is inferred that diverse ligands included in the cobalt precursor used as a metal organic source react incompletely to remain within the CVD cobalt layer, thereby generating the impurities. Because the deposition mechanism of a thin film by MOCVD is not clearly known, the remaining impurities may not be blocked. Such impurities diffuse within the cobalt layer during a subsequent first annealing. When diffusion occurs, cobalt oxide and cobalt carbide are formed within the cobalt layer. Cobalt oxide and cobalt carbide are nonmetal materials, which may be difficult to remove by stripping that eliminates the residual cobalt layer. Consequently, the impurities, such as cobalt oxide and/or cobalt carbide, may remain within the cobalt silicide layer formed after a secondary annealing. Therefore, these impurities may be removed to decrease the resistance of the cobalt salicide layer.

One method of removing the impurities that remain within the cobalt silicide layer is hydrogen plasma processing performed during or after MOCVD. When the hydrogen plasma process is performed during MOCVD), deposition and hydrogen plasma processing of the CVD cobalt layer may be repeated several times. Hydrogen gas may be supplied at a flow of about 100 sccm to 5000 sccm, for example. Hydrogen plasma processing is performed to inhibit the generation of cobalt carbide and/or cobalt oxide by inciting the reaction of hydrogen with carbon or oxide included in the cobalt layer. The hydrogen plasma process is optional in accordance with various embodiments of the present invention. Another method of removing the impurities within the cobalt silicon layer is a first annealing under an ultra high vacuum (UHV) (see, e.g., S15).

Still referring to FIG. 1, a capping layer is formed on the CVD cobalt layer (S14). The capping layer may inhibit the formation of impurities, such as an oxide layer, which forms naturally on the surface of the CVD cobalt layer once exposed to the atmosphere. Accordingly, if the CVD cobalt layer and the subsequent first annealing are formed in-situ, the capping layer may be omitted. In addition, the capping layer may be formed in-situ after forming the CVD cobalt layer to inhibit the naturally formed oxide layer, but is not necessarily restricted thereto. That is, a vacuum break may occur between forming the CVD cobalt layer and forming the capping layer.

The capping layer is typically deposited via PVD, but CVD or atomic layer deposition may be used. PVD is typically performed under a vacuum, and the pressure within a processing chamber may range from approximately $10^{-6}$ to $10^{-3}$ torr. The capping layer has a thickness of about 10 to 300 Å, but preferably is about 50 to 300 Å.

The capping layer may be comprise a Ti layer, TiN layer or a composite layer of Ti and TiN. A single Ti layer may be preferable because, when a TiN layer is formed on the Ti layer, the TiN layer may hinder outgassing of impurities during the subsequent first annealing. Such impurities remain as a nonconductive material within the cobalt salicide layer, thereby increasing the resistance of the cobalt salicide layer.

Moreover, the Ti capping layer may inhibit oxidation of the cobalt layer and also deoxidize the cobalt oxide layer formed on the cobalt layer.

Referring to FIG. 1, first annealing is performed to promote reaction between the double cobalt layer and the silicon (S15). The first annealing allows cobalt and silicon to react with each other, thereby forming a first CoSi layer. The first annealing may be a Rapid Thermal Process (RTP) or a furnace process. Also, the first annealing may be performed under an ultra high vacuum or atmospheric pressure (roughly 740 torr) at a temperature of about 300 to 600° C. For example, when RTP is performed with a pressure of about 740 torr, the temperature may be about 460° C. using nitrogen or an inert gas as an ambient gas. If RTP is performed with a pressure of about $10^{-7}$ torr, then the temperature may be approximately 585° C.

Under an ultra high vacuum, the pressure within the annealing chamber may be less than a few torr, such as about $10^{-9}$ to $10^{-3}$ torr. When the pressure is $10^{-3}$ torr or thereabout, nitrogen, argon or helium may be used as an ambient gas. When the pressure is less than $10^{-6}$ torr, no ambient gas is needed. To take the annealing chamber to an ultra high vacuum, gases within the processing chamber are continuously expelled (i.e., outgas) when annealing. Under an ultra high vacuum, impurities such as oxygen or carbon activated by annealing are diffused out, making it possible to reduce the impurities remaining in the cobalt layer. When the oxide layer is formed naturally on the surface of the cobalt layer, it can be removed when carrying out the outgas process.

Referring to FIG. 1, stripping is performed to remove any of the remaining double cobalt layer that has not changed to the CoSi layer and the capping layer (S16). The remaining double cobalt layer and the capping layer can be removed via wet etching using a metal etchant. The metal etchant may include sulfuric acid, acetic acid and/or nitric acid.

The semiconductor device is annealed a second time to form a second $CoSi_2$ layer, i.e., a double cobalt salicide layer (S17). Second annealing is carried out to convert the first CoSi layer to the second $CoSi_2$ layer with a relatively low sheet resistance. Therefore, the second annealing may be performed at a temperature of about 600 to 1000° C. There is no need to perform the second annealing under an ultra high vacuum as for the first annealing. For example, the second annealing may be performed at a pressure of about 740 torr, or under the ultra high vacuum.

Methods of manufacturing semiconductor devices having a double cobalt salicide layer will now be described. FIGS. 2A through 2E illustrate methods of fabricating a semiconductor device having a double cobalt salicide layer according to some embodiments of the present invention. The metal salicide layer may be formed as described above in accordance with some embodiments of the present invention. Operations already described above may be described briefly in the interest of brevity. In the drawings, the metal salicide layer, e.g., the cobalt salicide layer, is formed on the gate line pattern and source/drain regions. However, methods of forming a double metal salicide layer according to various embodiments of the present invention can be applied to other semiconductor device components that include a metal salicide layer.

Figure 2A:
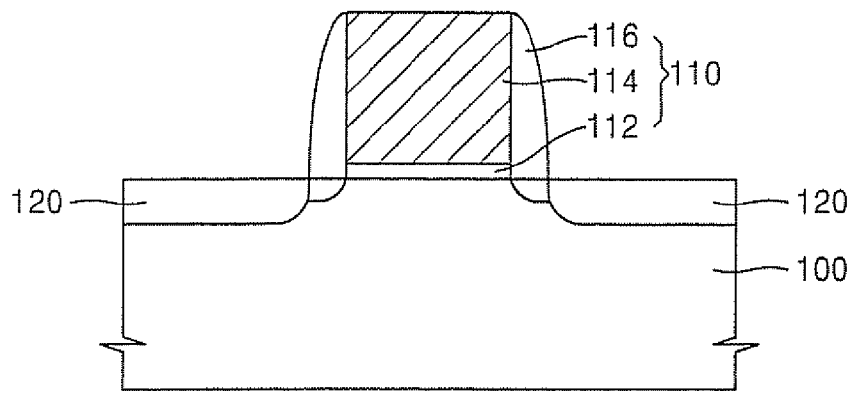
FIGS. 2A through 2E illustrate methods of fabricating a semiconductor device having a double cobalt salicide layer according to some embodiments of the present invention.

Referring to FIG. 2A, a silicon substrate 100 is prepared. A device isolating region (not shown) that defines an active region is formed on the silicon substrate 100. The device isolating region may be a shallow trench isolation (STI) region, for example. A transistor, such as a MOS transistor, including a gate electrode structure 110 and source/drain regions 120, is fabricated on the silicon substrate 100. The gate electrode structure 110 includes a gate oxide layer pattern 112, a polysilicon layer pattern 114 stacked on the gate oxide layer pattern 112, and spacers 116 formed on sidewalls of the polysilicon layer pattern 114 and the gate oxide layer pattern 112. In some cases, the gate electrode structure 110 further includes a hard mask layer pattern (not shown) formed on the upper surface of the polysilicon layer pattern 114. Also, the source/drain regions 120 may have a Lightly Doped Drain (LDD) structure as illustrated.

Figure 2B:
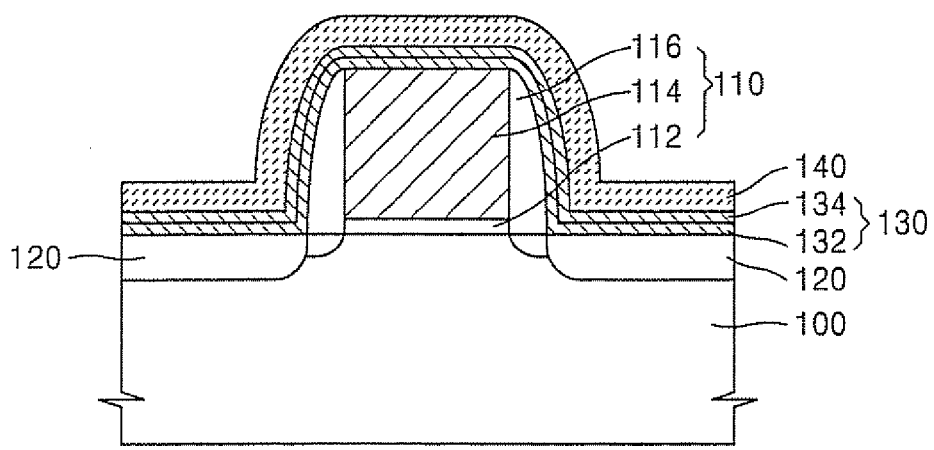

Referring to FIG. 2B, a double cobalt layer 130 is formed on the resultant structure. Prior to forming the double cobalt layer 130, wet cleaning with dilute hydrofluoric acid may be performed to remove impurities, such as a naturally forming oxide layer. The double cobalt layer 130 includes a PVD cobalt layer 132 and a CVD cobalt layer 134 formed on the PVD cobalt layer 132. The PVD cobalt layer 132 and the CVD cobalt layer 134 may be formed in-situ, but are not restricted thereto. The double cobalt layer 130 is formed on at least the source/drain regions 120 and the polysilicon layer pattern 114. The double cobalt layer 130 may have a thickness of about 50 to 500 Å in which the PVD cobalt layer 132 and the CVD cobalt layer 134 each have a thickness of about 10 to 300 Å. The CVD cobalt layer 134 may be formed by MOCVD using a cobalt precursor defined by the chemical formula: $Co_2(CO)_6(R_1-C\equiv C-R_2)$ (where, $R_1$ includes H or $CH_3$, and $R_2$ includes hydrogen, T-butyl, phenyl, methyl or ethyl). Optionally, during formation of the CVD cobalt layer 134 or after forming the double cobalt layer 130, hydrogen plasma processing of the resultant structure may be performed.

The capping layer 140 is optionally formed on the CVD cobalt layer 134. For example, when forming the CVD cobalt layer 134 and performing the subsequent first annealing in-situ under a vacuum, the capping layer 140 can be omitted. The capping layer 140 may comprise a single Ti layer or TiN layer, or a composite layer of Ti/TiN. In some embodiments, the single Ti layer may be more preferable. The Ti layer 140 may have a thickness of about 50 to 300 Å, for example.

Figure 2C:
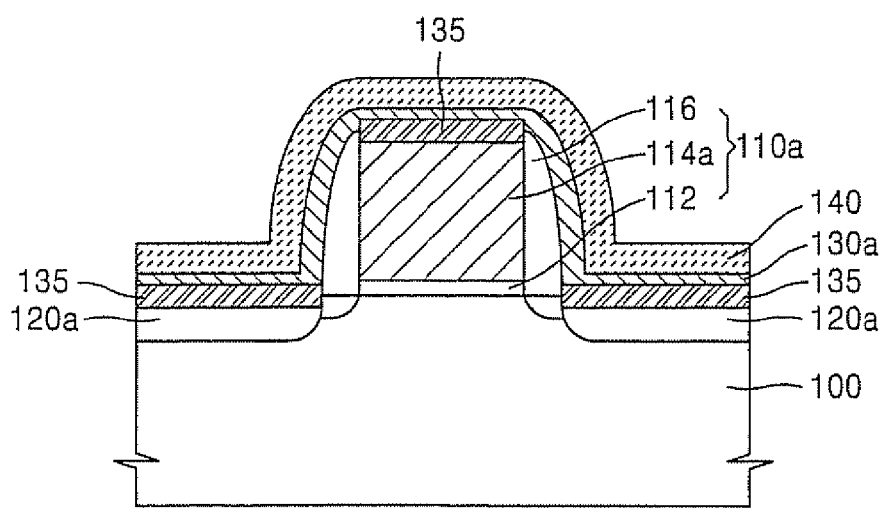

Referring to FIG. 2C, the semiconductor device on which the double cobalt layer 130 and the Ti layer 140 are deposited is annealed a first time. The first annealing may use nitrogen gas as an ambient gas or be under an ultra high vacuum. The first annealing may be carried out at a temperature of about 300 to 600° C., or, more preferably, at a temperature of about 400 to 500° C. for about 90 seconds. Annealing may be a furnace process, or, in some embodiments a RTP.

It is known that at about 400 to 450° C. a phase shift to $Co_2Si$ or CoSi occurs from a reaction of cobalt with silicon. It is also known that the phase shift to $CoSi_2$ occurs at about 600° C. and higher. Therefore, when annealing is performed at the lower temperature range, cobalt and silicon 114 and 120 may react with each other to from the $Co_2Si$ layer or CoSi layer 135 (hereinafter referred to as a "first cobalt silicide layer").

Figure 2D:
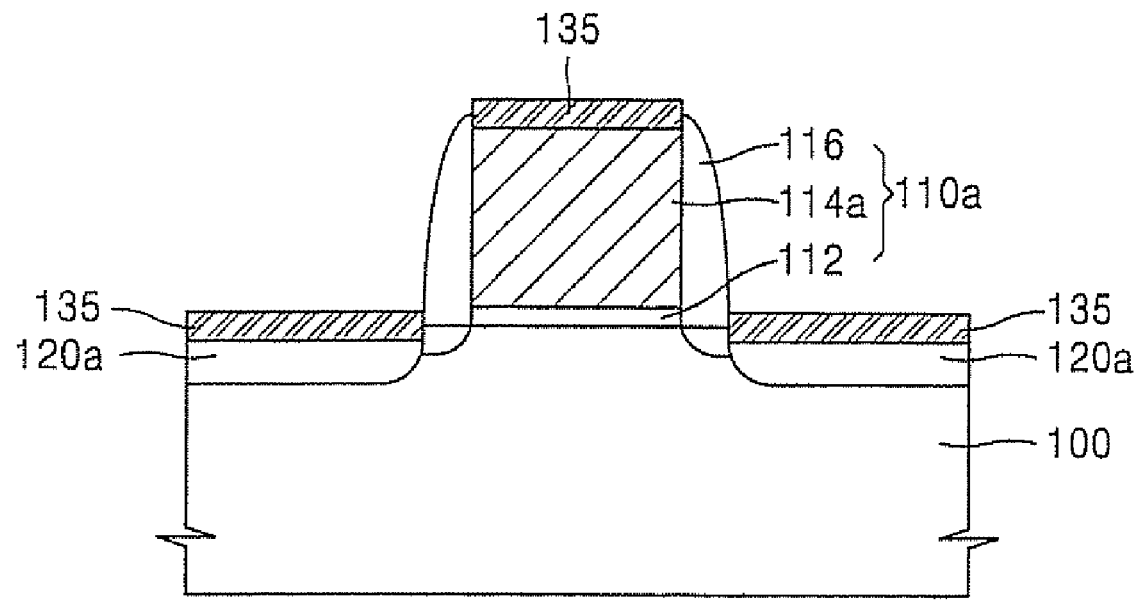

Referring to FIG. 2D, stripping is performed to remove the Ti layer 140 and any unreacted cobalt layer 130a. The stripping may be performed by wet etching using a metal etchant, such as phosphoric acid, acetate acid, and/or nitric acid. By doing so, the first cobalt silicide layer 135 and the spacers 116 of the gate electrode structure are exposed on the surface of the silicon substrate 100.

Figure 2E:
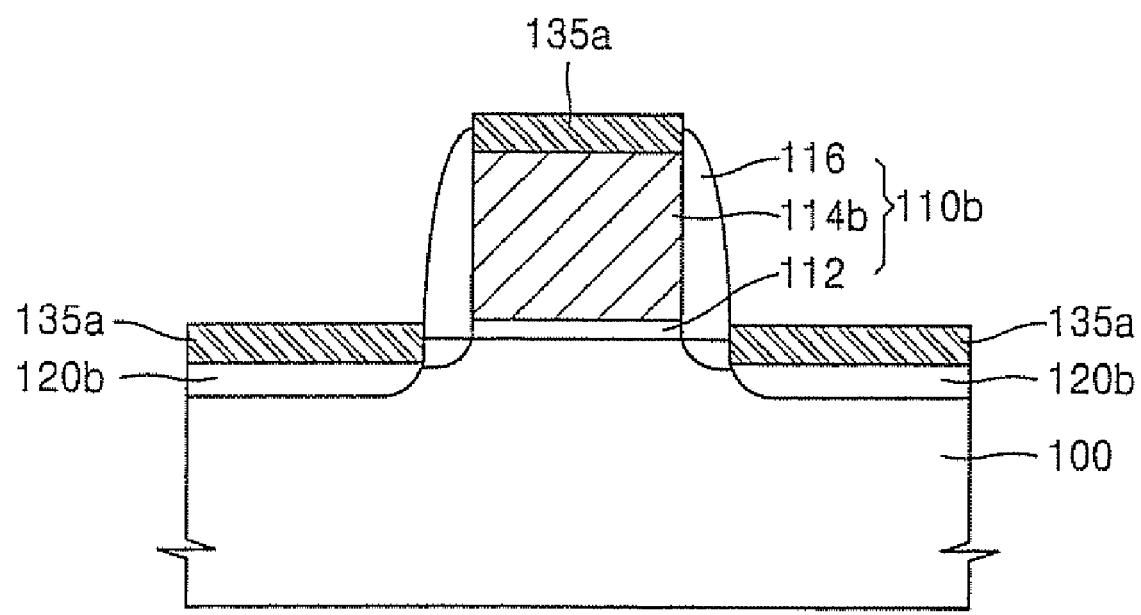

Referring to FIG. 2E, the silicon substrate is annealed a second time to form a second cobalt salicide ($CoSi_2$) layer 135a. The second annealing is performed at a temperature of about 600 to 1000° C., or, preferably, about 700 to 900° C., for about 30 seconds. The second annealing allows the first cobalt silicide layer 135 to react with a polysilicon pattern 114a of the gate line structure 110a and silicon 120a of source/drain regions 120b, which may result in a phase shift to the CoSi$_2$ layer 135a. The silicon of the source/drain regions 120b may not be completely used for the newly formed CoSi$_2$ layer 135a. That is, as illustrated, the source/drain regions 120b may be partially left below the CoSi$_2$ layer 135a. The second CoSi$_2$ layer 135a is formed on the upper surface of the gate electrode structure and the upper surface of the source/drain regions 120b. Thereafter, the semiconductor device may be completed using conventional semiconductor manufacturing methods.

According to the embodiments of the present invention described above with respect to FIGS. 2A through 2E, a double cobalt layer comprising a PVD cobalt layer and a CVD cobalt layer is formed on an exposed surface of the silicon and is then annealed to form a double cobalt salicide layer. The method of forming the double cobalt layer may reduce the likelihood of agglomeration of a cobalt salicide layer formed on a gate line, regardless of decreased gate line width, while also inhibiting an increase of junction leakage current due to the cobalt salicide layer formed on the source/drain regions. These characteristics of the cobalt salicide layer formed according to various embodiments of the present invention can be illustrated using graphs obtained by measuring sheet resistance and leakage current, shown in FIGS. 3A, 3B, 4A and 4B.

Figure 3A:
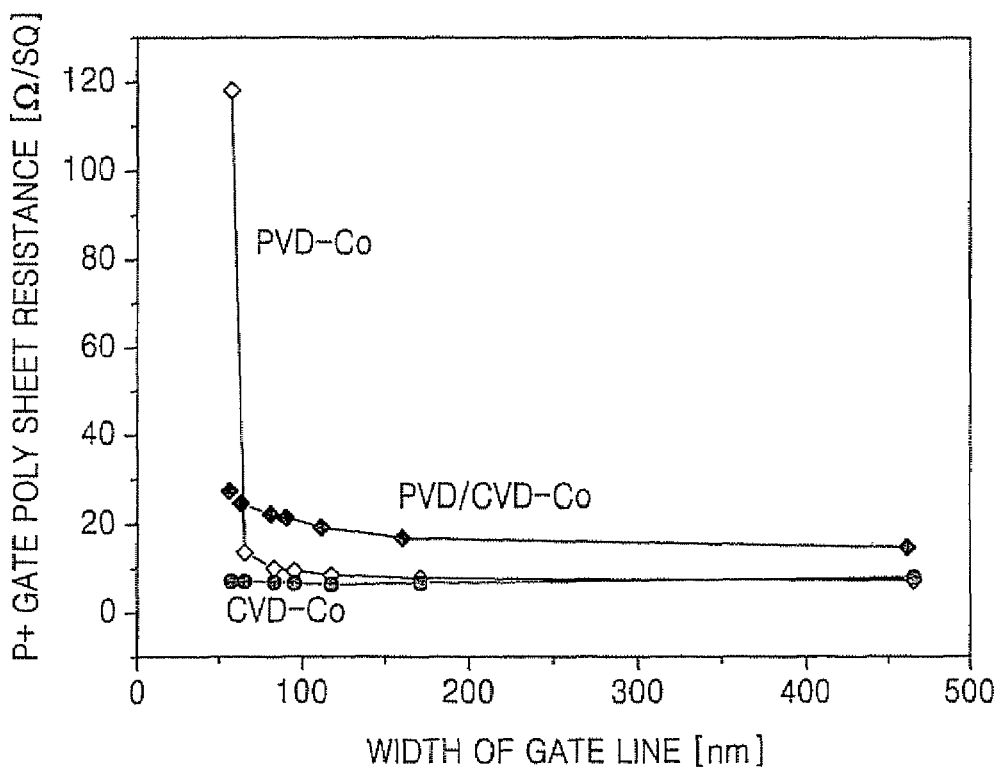
FIG. 3A is a graph that plots sheet resistance of a PVD cobalt salicide layer, a CVD cobalt salicide layer, and a double cobalt salicide layer, which are formed on a gate line comprising P+ polysilicon.
Figure 3B:
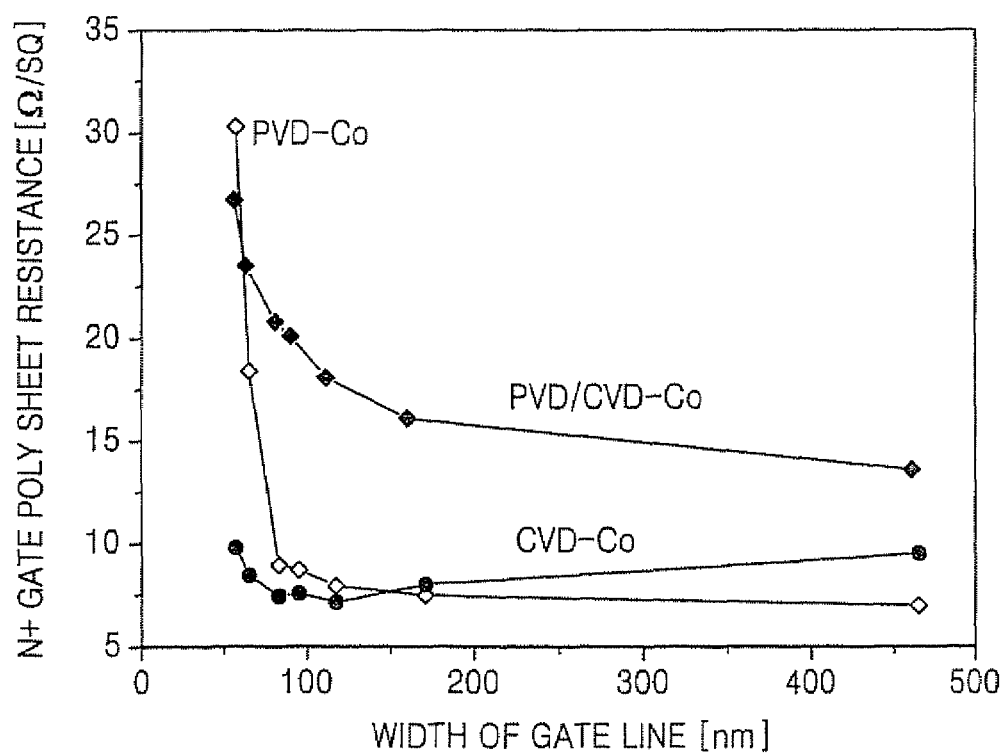
FIG. 3B is a graph that plots sheet resistance of a PVD cobalt salicide layer, a CVD cobalt salicide layer, and a double cobalt salicide layer, which are formed on a gate line comprising N+ polysilicon.

FIGS. 3A and 3B are graphs plotting the sheet resistance of the cobalt salicide layer according to variation of the gate line. Here, the polysilicon pattern 114 of the gate line structure 110 comprises a P+ polysilicon or an N+ polysilicon, respectively. The graphs also show the sheet resistance of the PVD cobalt salicide layer and the CVD cobalt salicide layer formed using conventional methods compared with that of the double cobalt salicide layer formed according to embodiments of the present invention.

Referring to FIG. 3A, in connection with the P+ polysilicon gate, the CVD cobalt salicide layer shows almost no variation in sheet resistance in spite of the decreased width of the gate line. This shows that the CVD cobalt salicide layer likely incurs almost no agglomeration. However, the sheet resistance of the PVD cobalt salicide layer increases abruptly when the gate line width is decreased to 70 nm or less. This is likely because the PVD cobalt salicide layer has severe agglomeration or, in some cases, the PVD cobalt salicide layer is disconnected. The double cobalt salicide layer shows only a slight increase in sheet resistance below about 70 nm as the gate line width is decreased. Therefore, it can be seen that almost no agglomeration likely occurs.

Referring to FIG. 3B, in connection with the N+ polysilicon gate, the PVD cobalt salicide layer and the CVD cobalt salicide layer have properties approximately equal to those described with reference to FIG. 3A. In the case of the double cobalt salicide layer, the sheet resistance increases slightly with the decrease of the gate line width, but the increase is minor compared with the PVD cobalt salicide layer. Therefore, even though the width of the gate line becomes narrower, the double cobalt salicide layer incurs little or no agglomeration of the cobalt salicide due to the CVD cobalt salicide layer.

Figure 3C:
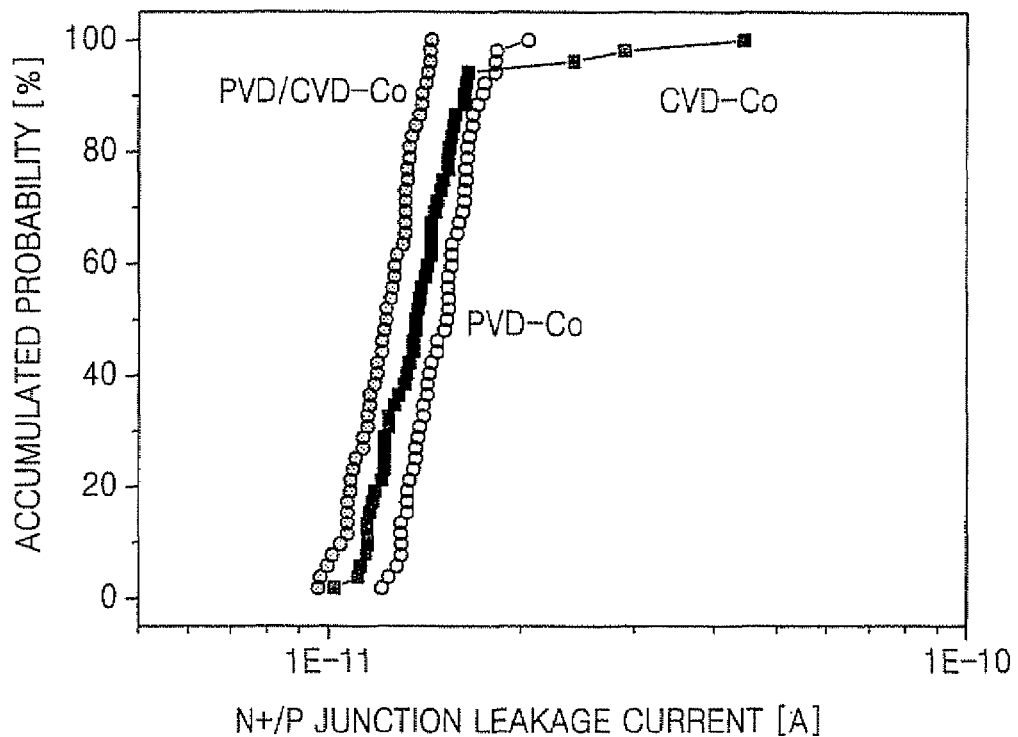
FIG. 3C is a graph that plots junction leakage currents of a PVD cobalt salicide layer, a CVD cobalt salicide layer, and a double cobalt salicide layer, which are formed on an N+/P junction.
Figure 3D:
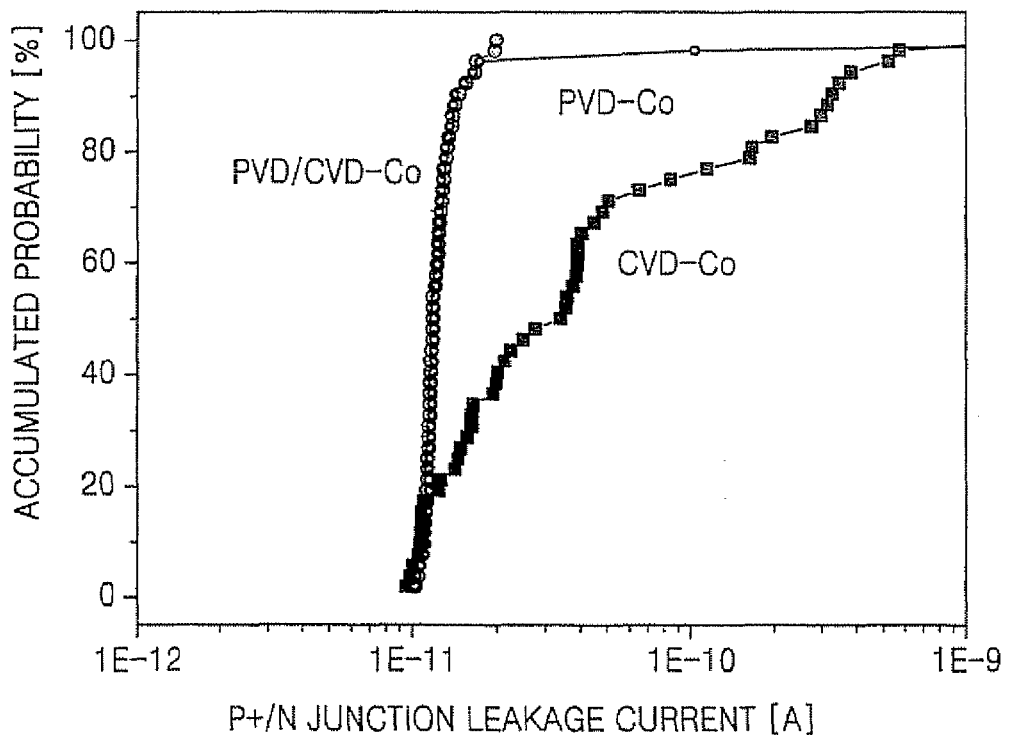
FIG. 3D is a graph that plots junction leakage currents of a PVD cobalt salicide layer, a CVD cobalt salicide layer, and a double cobalt salicide layer, which are formed on a P+/N junction.

FIGS. 3C and 3D are graphs that plot junction leakage currents in the source/drain regions. FIG. 3C shows the junction leakage current of an N+/P junction when N+ source/drain regions are formed by implanting an N-type impurity into the silicon substrate in which a P-type well is formed. FIG. 3D shows the junction leakage current of a P+/N junction when P+ source/drain regions are formed by implanting a P-type impurity into the silicon substrate in which an N-type well is formed. The graphs show the junction leakage currents of the PVD cobalt salicide layer and the CVD cobalt salicide layer formed using the conventional technique compared with the junction leakage current of the double cobalt salicide layer formed according to some embodiments of the present invention.

Referring to FIG. 3C, the CVD cobalt salicide layer and the PVD cobalt salicide layer have almost no difference in junction leakage current in the N+/P junction. The N+/P junction leakage current of the double cobalt salicide layer, according to embodiments of the present invention, is less than the leakage currents of the PVD cobalt salicide layer and the CVD cobalt salicide layer. Therefore, the N+/P junction leakage current characteristic of the double cobalt salicide layer is generally excellent.

Referring to FIG. 3D, the junction leakage current of the P+/N junction of the CVD cobalt salicide layer is higher than that of the PVD cobalt salicide layer. This is because the deposition temperature of the CVD cobalt salicide layer is too low to easily control its thickness. Moreover, the bottom surface of the cobalt salicide layer is very uneven. The PVD cobalt salicide layer and the double salicide layer display almost equal junction leakage current in the P+/N junction. Consequently, when the double cobalt salicide layer is formed on the source/drain regions, the junction leakage current characteristics are equal or better than that of the PVD cobalt salicide layer.

According to some embodiments of the present invention, agglomeration of the metal salicide layer formed on the gate line can be inhibited in subsequent annealing even when the gate line width becomes narrower. For example, even when the gate line width is decreased to 70 nm or less, the metal salicide layer can be continuously used on the gate line. Therefore, embodiments of the present invention can be used in manufacturing a high-speed semiconductor device with a relatively high integration density and low resistance.

Furthermore, regardless of the decrease of the dimensions of patterns, the likelihood of an increase of junction leakage current of the source/drain regions including the metal salicide can be reduced to produce a highly reliable semiconductor device.

Moreover, by forming a double metal salicide layer on both a gate line and the source/drain regions, a separate process is not needed to form an insulating layer and pattern so as to form an opening only for a gate line, thereby simplifying the manufacturing processes. Additionally, since the process is similar to that of the conventional method of forming the PVD salicide layer, there is no need to install new manufacturing facilities for constructing.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of fabricating a semiconductor device, comprising:
    forming a gate electrode structure, comprising a gate oxide layer pattern, a polysilicon layer pattern, and sidewall spacers on a silicon substrate;
    forming source/drain regions on both sides of the gate electrode structure in the silicon substrate;
    depositing a physical vapor deposition (PVD) cobalt layer on the gate electrode structure using PVD;
    depositing a chemical vapor deposition (CVD) cobalt layer on the PVD cobalt layer using CVD;

annealing the silicon substrate to react the PVD and CVD cobalt layers with polysilicon on an upper surface of the gate electrode structure;

stripping at least a portion of the PVD cobalt layer and the CVD cobalt layer that has not reacted; and annealing the silicon substrate after stripping the at least the portion of the PVD cobalt layer and the CVD cobalt layer.

2. The method of claim 1, wherein the PVD cobalt layer is deposited at a temperature of about 300 to 400° C., and the CVD cobalt layer is deposited at a temperature of about 100 to 200° C.

3. The method of claim 1, wherein depositing the CVD cobalt layer and annealing the silicon substrate to react the PVD and CVD cobalt layers are performed in-situ.

4. The method of claim 1, wherein depositing the CVD cobalt layer is performed at a pressure of about $10^{-3}$ to 20 torr.

5. The method of claim 1, wherein the PVD cobalt layer and the CVD cobalt layer each have a thickness of about 10 to 190 Å.

6. The method of claim 1, wherein depositing the CVD cobalt layer comprises forming the cobalt layer by MOCVD using a cobalt precursor defined by the chemical formula: $Co_2(CO)_6(R_1—C\equiv C—R_2)$ where, $R_1$ includes H or $CH_3$, and $R_2$ includes hydrogen, t-butyl, phenyl, methyl or ethyl, as a source gas.

7. The method of claim 1, wherein depositing the PVD cobalt layer and depositing the CVD cobalt layer are performed in-situ.

8. The method of claim 1, further comprising:

forming a capping layer on the double cobalt layer before annealing the silicon substrate to react the double cobalt layer; and wherein stripping at least the portion of the double cobalt layer comprises stripping the capping layer and at least the portion of the double cobalt layer that has not reacted with the silicon surface.

9. The method of claim 3, wherein annealing the silicon substrate to react the PVD and CVD cobalt layers is performed at a pressure of about $10^{-9}$ to $10^{-3}$ torr.

10. The method of claim 6, wherein the cobalt precursor is $Co_2(CO)_6(HC\equiv C^tBu)$, $Co_2(CO)_6(HC\equiv CPh)$, $Co_2(CO)_6(HC\equiv CH)$, $Co_2(CO)_6(HC\equiv CCH_3)$ or $Co_2(CO)_6(CH_3C\equiv CCH_3)$.

11. The method of claim 6, wherein depositing the CVD cobalt layer comprises:

forming a preliminary CVD cobalt layer using MOCVD by supplying the cobalt precursor as the source gas; and treating a surface the preliminary cobalt layer under a hydrogen ambient to remove impurities included in the preliminary cobalt layer.

12. The method of claim 11, wherein forming the preliminary CVD cobalt layer and treating the surface are each performed more than once.

\* \* \* \* \*